(12) United States Patent
Itoh et al.

(10) Patent No.: US 7,683,491 B2
(45) Date of Patent: Mar. 23, 2010

(54) SEMICONDUCTOR DEVICE

(75) Inventors: Mikihiko Itoh, Tokyo (JP); Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 11/943,142

(22) Filed: Nov. 20, 2007

(65) Prior Publication Data

US 2008/0122064 A1 May 29, 2008

(30) Foreign Application Priority Data

Nov. 24, 2006 (JP) ............................... 2006-317523

(51) Int. Cl.
*H01L 23/48* (2006.01)

(52) U.S. Cl. .................. 257/777; 257/685; 257/723; 257/691; 257/E25.005; 257/E25.006; 257/E25.021; 257/E25.027; 257/E23.085

(58) Field of Classification Search .................. 257/685, 257/686, 723, 777, E25.005, E25.006, E25.021, 257/E25.027, E23.085
See application file for complete search history.

(56) References Cited

U.S. PATENT DOCUMENTS

| 6,605,875 | B2 * | 8/2003 | Eskildsen ................... 257/777 |
| 6,650,008 | B2 | 11/2003 | Tsai et al. |
| 6,900,528 | B2 | 5/2005 | Mess et al. |
| 2004/0145042 | A1 | 7/2004 | Morita et al. |
| 2006/0076690 | A1 * | 4/2006 | Khandros et al. ........... 257/777 |

FOREIGN PATENT DOCUMENTS

JP          2004-221215          8/2004

* cited by examiner

*Primary Examiner*—Jasmine J Clark
(74) *Attorney, Agent, or Firm*—Oblon, Spivak, McClelland, Maier & Neustadt, L.L.P.

(57) ABSTRACT

An aspect of the semiconductor device comprising a package substrate which has a plurality of pads to which a power supply voltage is applied on an upper surface thereof, a first memory chip which is arranged on the package substrate and has a first power supply pad provided on a first side and a second power supply pad provided on a second side perpendicular to the first side, and a second memory chip which is translated in a direction along which the first and second power supply pads of the first memory chip are exposed, arranged on the first memory chip, and has the same structure as the first memory chip, wherein the first and second power supply pads are provided at diagonal corners of the first memory chip, respectively.

16 Claims, 7 Drawing Sheets

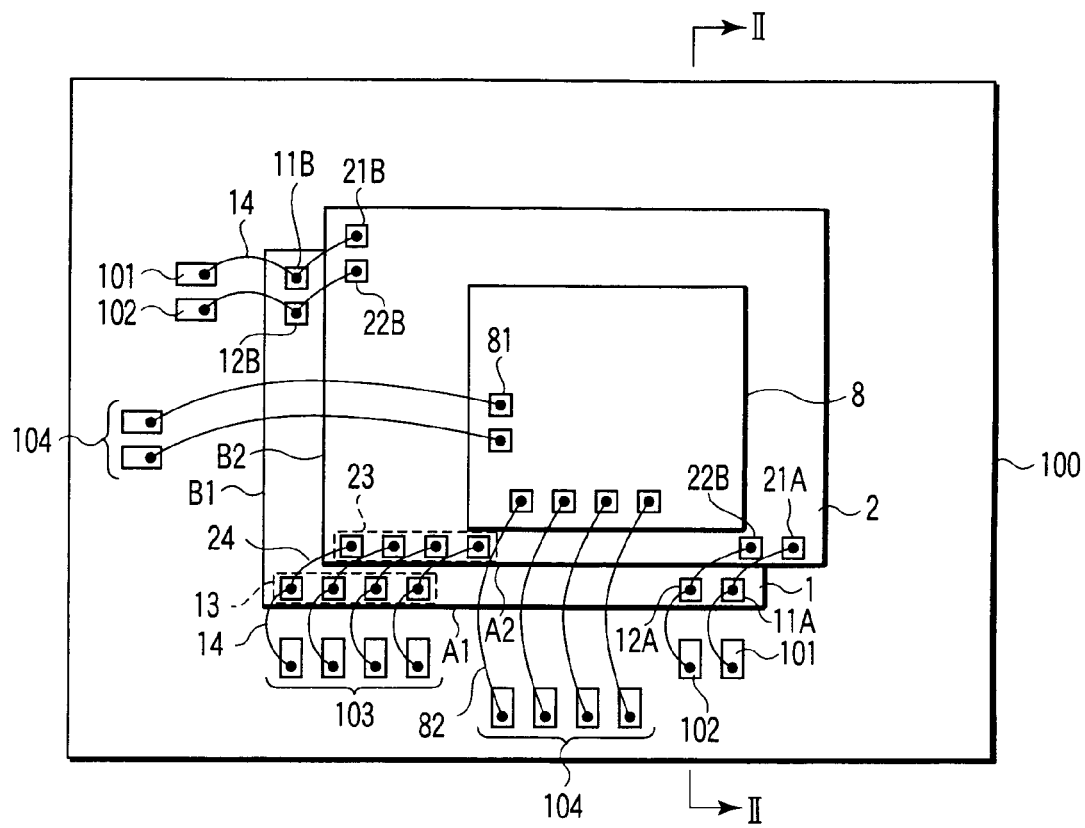
F I G. 1
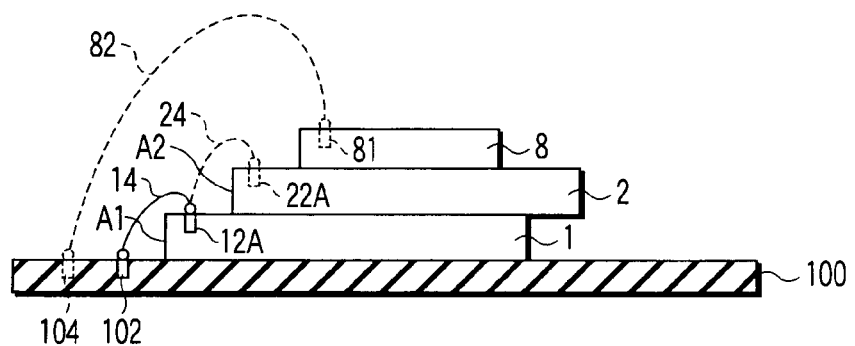
F I G. 2

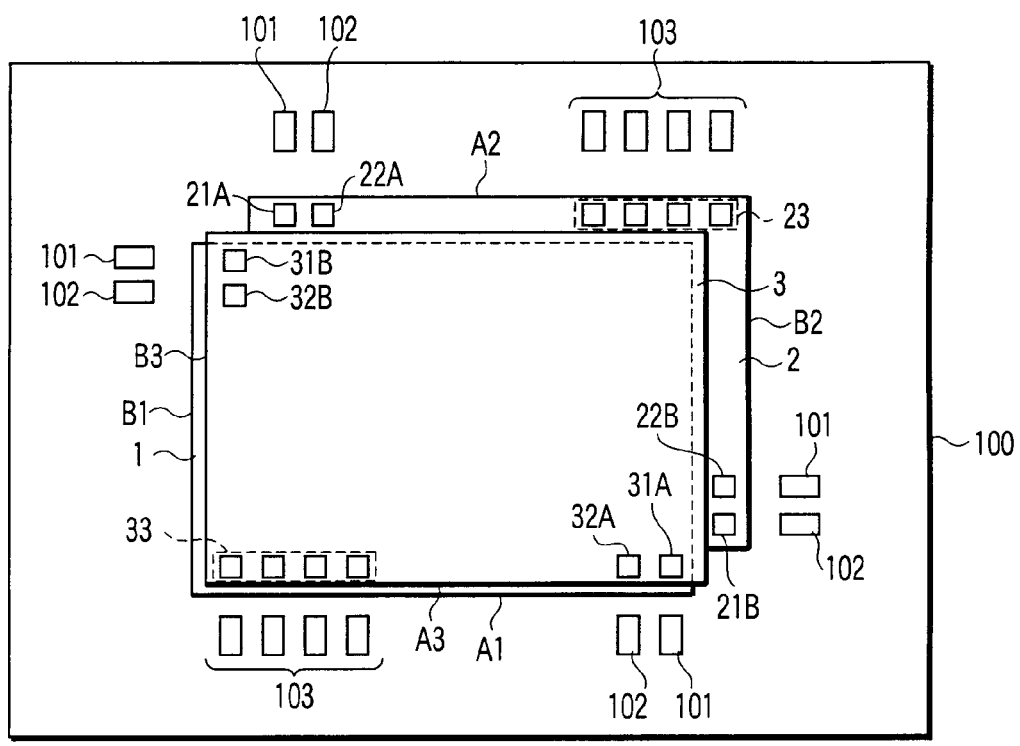
F I G. 11

SEMICONDUCTOR DEVICE

CROSS-REFERENCE TO RELATED APPLICATIONS

This application is based upon and claims the benefit of priority from prior Japanese Patent Application No. 2006-317523, filed Nov. 24, 2006, the entire contents of which are incorporated herein by reference.

BACKGROUND OF THE INVENTION

1. Field of the Invention

The present invention relates to a semiconductor device, and more particularly to a multichip package.

2. Description of the Related Art

For example, a demand for miniaturization of a package of a portable electronic device as typified by a mobile phone has been swiftly increased because of its characteristics.

Therefore, a multichip package (MCP) technology of laminating a plurality of semiconductor chips on an insulating substrate to be formed as one package is used.

In particular, when a memory chip, e.g., a random access memory (RAM) or a flash memory and a controller chip thereof are packaged based on the MCP technology, since a higher capacity of a memory is preferable, the plurality of memory chips are laminated in many cases.

Since electroconductive pads are respectively provided on a package substrate, a memory chip, and a controller chip, these members are electrically connected with each other by connecting their pads through bonding wires.

Therefore, each chip is laminated while assuring a space where wire bonding can be effected near the pad provided on each chip.

In the multichip package, since the memory chips to be laminated usually have substantially the same size, when these memory chips are simply laminated, the pad on a chip that is arranged on a lower layer side is not exposed, and wire bonding cannot be performed.

Therefore, a multichip package in which pads are provided along one or two sides of each memory chip and the chips are laminated in a zigzag pattern so that the pads on the respective chips are exposed has been proposed (see, e.g., JP-A 2004-221215 [KOKAI]).

However, when a power supply pad that supplies a power supply voltage or a ground pad that supplies a ground voltage is arranged while being biased to one side of each memory chip surface, a voltage distribution in each chip becomes non-uniform. That is because a power supply voltage and a ground voltage are supplied to a region apart from the pad of such a chip through wiring lines in each chip, an internal wiring resistance thereof is generally large, and an influence of a drop in voltage becomes larger as distanced from the pad.

Therefore, when a consumption current is increased, a reduction in the power supply voltage and an increase in the ground voltage in the region apart from the bonded pad cannot be suppressed because of the internal wiring resistance, thereby decreasing performance of each memory chip.

Further, since the plurality of memory chips are laminated while being staggered in the same direction so that a pad region of each chip is exposed, a package size becomes large in a staggering direction.

BRIEF SUMMARY OF THE INVENTION

An aspect of a semiconductor device comprising: a package substrate which has a plurality of pads to which a power supply voltage is supplied on an upper surface thereof; a first memory chip which is arranged on the package substrate and has a first power supply pad provided on a first side and a second power supply pad provided on a second side perpendicular to the first side; and a second memory chip which is translated in a direction along which the first and second power supply pads of the first memory chip are exposed, and arranged on the first memory chip, wherein the first and second power supply pads are provided at diagonal corners of the first memory chip, respectively.

An aspect of a semiconductor device comprising: a package substrate which has a plurality of pads to which a power supply voltage is supplied on an upper surface thereof; a first memory chip which is arranged on the package substrate and has a first power supply pad provided on a first side and a second power supply pad provided on a second side perpendicular to the first side; a second memory chip which is translated in a direction along which the first and second power supply pads of the first memory chip are exposed, and arranged on the first memory chip; and a third memory chip which is translated in a direction opposite to the translating direction of the second memory chip, and arranged on the second memory chip through a spacer at a position where it overlaps the first memory chip, wherein the first and second power supply pads are provided at diagonal corners of the first memory chip, respectively.

An aspect of a semiconductor device comprising: a package substrate; a first memory chip which is arranged on the package substrate and has a first power supply pad provided on a first side and a second power supply pad provided on a second side perpendicular to the first side; a second memory chip which is opposite to the first memory chip in a lateral direction, translated in a direction along which the first and second power supply pads of the first memory chip are exposed, and arranged on the first memory chip; and a third memory chip which is translated in a direction opposite to the translating direction of the second memory chip and arranged on the second memory chip, wherein the first and second power supply pads are provided at diagonal corners of the first memory chip, respectively.

BRIEF DESCRIPTION OF THE SEVERAL VIEWS OF THE DRAWING

FIG. 1 is a plan view of a multichip package showing a basic configuration of a first embodiment;

FIG. 2 is a cross-sectional view taken along a line II-II in FIG. 1;

FIG. 11 is a plan view showing the configuration depicted in FIG. 7 in stages;

DETAILED DESCRIPTION OF THE INVENTION

Figure 3:
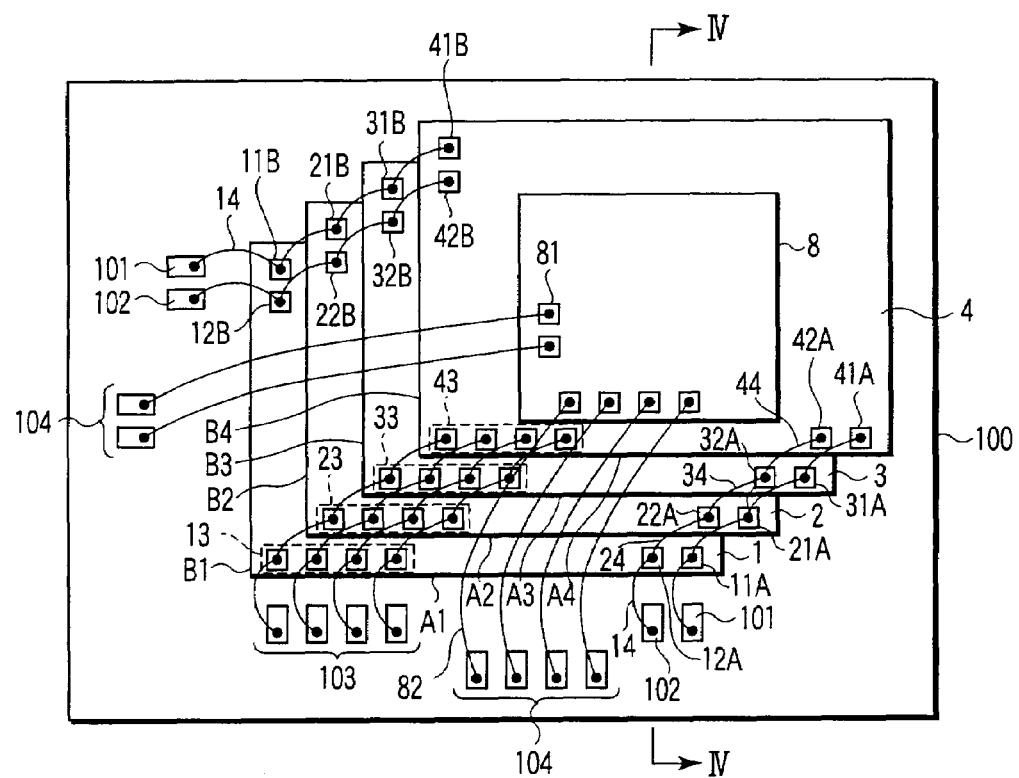
FIG. 3 is a plan view of a multichip package showing an application example of the first embodiment.

Several embodiments for carrying out the present invention will now be explained hereinafter in detail with reference to the accompanying drawings.

1. Outline

A semiconductor device according to an example of the present invention relates to a multichip package in which a plurality of memory chips are laminated.

The plurality of memory chip have, e.g., the same structure, and power supply pads, ground pads, and memory pads are provided along two sides (a first side and a second side) perpendicular to each other in four sides of an upper surface of each rectangular or square memory chip.

Furthermore, at least one power supply pad is provided along each of the first side and the second side, and the single power supply pad on each side is arranged at each diagonal corner of the chip upper surface facing a diagonal line direction.

When such a memory chip is laminated, the following basic structure is provided. That is, the memory chip on an upper layer side is translated and laminated on an upper surface of the memory chip on a lower layer side in such a manner that the respective pads provided on the two sides perpendicular to each other are exposed, i.e., the power supply pad of the memory chip on the lower layer side is not hidden behind the memory chip on the upper layer side as seen from the upper side of the chips.

As a result, a voltage drop due to an internal wiring resistance of each chip can be alleviated.

Therefore, the multichip package according to the example of the present invention can avoid a reduction in performance and suppress an increase in a package size of the multichip package.

Moreover, a configuration of the multichip package based on the basic structure will be also explained hereinafter. Thus, a technology that can suppress an increase in the package size and increase a memory capacity of the multichip package is proposed.

2. EMBODIMENTS

(1) First Embodiment (a) Basic Structure

FIG. 1 is a plan view of a multichip package according to the first embodiment. Additionally, FIG. 2 is a cross-sectional view taken along a line II-II in FIG. 1.

A package substrate 100 is, e.g., an insulating substrate having an electroconductive wiring layer formed on a surface thereof.

On the surface of the package substrate 100 are provided substrate power supply pads 101, substrate ground pads 102, substrate memory pads 103, and substrate controller pads 104, respectively. It is to be noted that external terminals are provided at an outer edge portion or on a rear surface of the package substrate 100, but they are omitted in the drawing in this embodiment. The external terminals are, e.g., a lead frame electrically connected with the outer edge portion, a ball grid array (BGA) electrically connected with the rear surface of the package substrate 1, and others.

Further, although a wiring layer that connects the external terminals with respective pads 101, 102, 103, and 104 on the package substrate 100 is also provided on the surface of the package substrate 100, but this layer is also omitted in the drawing like the external terminals.

A first memory chip 1 is arranged on the package substrate (the insulating substrate) 100.

Power supply pads 11A and 11B, ground pads 12A and 12B, and a plurality of memory pads 13 are arranged on an upper surface of the first memory chip 1. These pads 11A, 11B, 12A, 12B, and 13 are formed of an electroconductive material.

At least one power supply pad 11A or 11B is provided on the upper surface of the first memory chip 1 along each of first and second sides A1 and B1 of the upper side of the first memory chip perpendicular to each other. It is to be noted that first side A1 is, e.g., a side whose length is longer that a length of second side B1.

Furthermore, the two power supply pads 11A and 11B are arranged at diagonal corners of the upper surface of the memory chip 1, respectively. Moreover, power supply pads 11A and 11B supply a power supply voltage that is required to drive the first memory chip 1.

Ground pads 12A and 12B are arranged at the diagonal corners of the upper surface of the memory chip 1 in such a manner that they are adjacent to power supply pads 11A and 11B along first side A1 and second side B1, respectively. Ground pads 12A and 12B supply a ground voltage serving as a reference potential.

It is to be noted that power supply pad 11A and ground pad 12A may be provided on the memory chip 1 in such a manner that they are arranged in an opposite pattern. This can be likewise applied to power supply pad 11B and ground pad 12B.

Additionally, the plurality of memory pads 13 are arranged along, e.g., first side A1. The memory pads 13 are constituted of a control signal pad, an input/output signal pad, and an address pad, and they are arranged in an arbitrary pattern. It is to be noted that the memory pads 13 may be provided along side B1.

A second memory chip 2 is arranged on the first memory chip 1. The second memory chip 2 is, e.g., a memory chip having substantially the same configuration as the first memory chip 1. Therefore, on an upper surface of the second memory chip 2 are provided power supply pads 21A and 21B, ground pads 22A and 22B, and a plurality of memory pads 23 in the same arrangement as the respective pads on the first memory chip 1 along first and second sides A2 and B2 of the second memory chip 2.

A controller chip 8 is arranged on the second memory chip. A size of the controller chip 8 is smaller than sizes of the first and second memory chips 1 and 2.

On a surface of the controller chip 8 are provided controller pads 81 for a control signal, a data input/output signal, and a power supply/ground voltage.

The memory chips 1 and 2 and the controller chip 8 are laminated on the package substrate 100 through thin insulating layers (not shown), e.g., an insulating adhesive.

It is to be noted that the controller chip 8 does not have to be provided at the uppermost part of the laminate chips, and a multichip package including the memory chips 1 and 2 alone may be adopted.

The respective pads provided on the package substrate 100, the first and second memory chips 1 and 2, and the controller chip 8 are connected with each other as follows. It is to be noted that FIG. 2 also shows pads and wires on a near side or a far side apart from a cross section taken along a line II-II and these members are indicated by broken lines.

The substrate power supply pads 101 are connected with power supply pads 11A and 11B of the first memory chip 1 and power supply pads 21A and 21B of the second memory chip based on wire bonding using wires 14 and 24, e.g., Au thin lines.

The substrate ground pads 102 are connected with ground pads 12A and 12B of the first memory chip and ground pads 22A and 22B of the second memory chip based on wire bonding.

Moreover, the substrate memory pads 103 are connected with the memory pads 13 of the first memory chip 1 and the memory pads 23 of the second memory chip 2 based on wire bonding.

It is to be noted that each pad of the second memory chip 2 is connected with each corresponding pad of the first memory chip through the wire 24 to be electrically connected with each pad of the package substrate 100 through the wire 14 extending from the first memory chip as shown in FIGS. 1 and 2.

When the chips are connected with each other in this manner, complicated wire bonding does not have to be carried out, and a parasitic capacitance of the wire bonded between pads having a large step can be suppressed.

The controller pads 104 are connected with the controller pads 81 through wires 82. The substrate controller pads 104 are constituted of a control signal pad, a data input/output pad, and a power supply pad. It is to be noted that the pads for the power supply and the ground on the controller chip 8 are connected with the pads 104 different from the substrate power supply pads 101 and the substrate ground pads 102 connected with the first and second memory chips as explained in this embodiment. That is because the controller chip 8 operates and a reduction in the power supply voltage and an increase in the ground voltage thereby occur when the power supply and ground pads of the controller chip 8 are connected with pads 101 and 102 as common pads for the first and second memory chips, which adversely affects the operations of the memory chips. On the other hand, when the power supply and ground pads of the controller chip 8 are connected with the substrate power supply pads 101 and the substrate ground pads 102 connected with the first and second memory chips, the number of the pads on the package substrate 100 can be reduced. According to this structure, a pitch between the pads can be widened, and short circuit can be prevented from occurring between the pads or between the wires.

In the above-explained multichip package, as shown in FIGS. 1 and 2, the second memory chip 2 on the upper layer side is translated and laminated on the first memory chip 1 in such a manner that the first side A1 and the second side B1 of the upper surface of the first memory chip 1 on the lower layer side perpendicular to each other are exposed. Therefore, the two chips can be laminated so that the respective pads provided along first and second sides A1 and B1 of the first memory chip 1 are exposed.

Accordingly, wire bonding can be effected along the two sides of each memory chip.

A direction along which the second memory chip is translated is, e.g., a diagonal direction with respect to the upper surface of the first memory chip 1. It is to be noted that this translating direction is not restricted to the diagonal direction and it may be a direction along which the first and second sides of the first memory chip on the lower layer side are exposed. Further, a size of a space that is exposed when the second memory chip is translated is a size which enables assuring a space required to perform wire bonding with respect to the pads.

Furthermore, as explained above, at least one power supply pad 11A or 11B provided on the first memory chip is disposed along each of sides A1 and B1, and the single power supply pad 11A or 11B along each side A1 or B1 is arranged at each diagonal corner of the upper surface of the memory chip 1.

For example, when power supply pads 11A and 11B are provided to be biased to side B1, an influence of a voltage drop due to an internal wiring resistance becomes larger as distanced from side B1 on which the power supply pads are provided. Therefore, a voltage distribution in the first memory chip 1 becomes non-uniform, and performance of the memory chip 1 is decreased.

However, when the power supply pads are provided at the respective diagonal corners of the memory chip like this embodiment, an influence of a voltage drop due to the internal wiring resistance can be alleviated, and the power supply voltage can be supplied to provide a further uniform voltage distribution in the memory chip. Furthermore, ground pads 12A and 12B are arranged to be adjacent to power supply pads 11A and 11B, respectively. When ground pads 12A and 12B are arranged at the respective diagonal corners on the chip, an increase in the ground voltage can be suppressed.

Therefore, a reduction in performance of the memory chip due to the internal wiring resistance of the memory chip can be avoided.

As explained above, in the multichip package in which the plurality of memory chips are laminated, the memory chip on the upper layer side is arranged on the memory chip on the lower layer side in such a manner that the two sides of the memory chip on the lower layer side perpendicular to each other are exposed. Therefore, the pads of the memory chip on the lower layer side can be provided along the exposed two sides.

Accordingly, the power supply pads and the ground pads that supply the power supply voltage and the ground voltage can be provided at the diagonal corners of the upper surface of the memory chip.

Therefore, in a region apart from the pads, a reduction in the power supply voltage and an increase in the ground voltage due to the internal wiring resistance in each chip can be suppressed.

Thus, a reduction in performance of the multichip package can be avoided.

(b) Example

Figure 4:
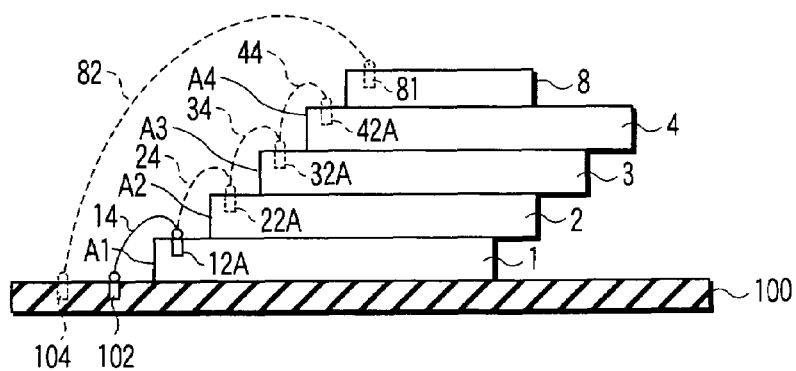
FIG. 4 is a cross-sectional view taken along a line IV-IV in FIG. 3.

FIGS. 3 and 4 are views showing an example of this embodiment. It is to be noted that like reference numerals denote members equal to those in the basic structure, thereby omitting a detailed explanation thereof.

As explained in the section of the basic structure, respective pads are provided on upper surfaces of first and second memory chips 1 and 2 along their first sides A1 and A2 and second sides B1 and B2, respectively.

Additionally, the second memory chip 2 is translated with respect to the upper surface of the first memory chip and laminated on the first memory chip 1 in such a manner that the respective pads of the first memory chip provided along sides A1 and B1 are exposed.

These first and second memory chips 1 and 2 are, e.g., flash memories.

This example further includes third and fourth memory chips 3 and 4 besides the first and second memory chips.

Each of the third and fourth memory chips 3 and 4 is a non-volatile semiconductor memory, e.g., a dynamic random access memory (DRAM).

Respective pads of the third and fourth memory chips 3 and 4 are provided on upper surfaces of the respective chips along two sides perpendicular to each other like the first and second memory chips 1 and 2.

That is, power supply pads 31A and 31B, ground pads 32A and 32B, and a plurality of memory pads 33 are provided on an upper surface of the third memory chip 3.

At least one power supply pad 31A or 31B is provided on the upper surface of the chip 3 along each of sides A3 and B3. Further, the single power supply pad 31A or 31B on each of sides A3 and B3 is provided at each diagonal corner of the upper surface of the memory chip 3.

Ground pads 32A and 32B are provided to be adjacent to power supply pads 31A and 31B along sides A3 and B3, respectively.

Furthermore, the plurality of memory pads 33 are provided on the upper surface of the chip 3 along side A3 of the third memory chip.

The fourth memory chip 4 has the same structure as the third memory chip 3, and power supply pads 41A and 41B, ground pads 42A and 42B, and memory pads 43 are provided on an upper surface of the chip 4 along sides A4 and B4, respectively.

It is to be noted that each of the third and fourth memory chips 3 and 4 may be a flash memory like the first and second memory chips.

Moreover, the memory chips are electrically connected with a package substrate 100 through the respective memory chips on a lower layer side.

As shown in FIGS. 3 and 4, the third memory chip 3 is laminated on the second memory chip in such a manner that the respective pads provided on the upper surface of the second memory chip along the two side shown in FIGS. 1 and 2 are exposed.

Additionally, the fourth memory chip 4 is laminated on the third memory chip 3 in such a manner that the respective pads on the upper surface of the third memory chip along the two sides A3 and B3 are exposed.

As shown in this example, the memory chips in two or more layers can be laminated. Therefore, the storage capacity of the multichip package can be increased.

Accordingly, in addition to the effect explained in the section of the basic structure, the storage capacity of the multichip package can be increased.

Further, it is possible to provide a multichip package in which different types of memory chips like a non-volatile memory and a volatile memory can be laminated and a plurality of different types of memory chips are included.

It is to be noted that the order of laminating the memory chips is not restricted to the above-explained order, and a volatile memory chip may be arranged on the lower layer side of a non-volatile memory chip. Furthermore, although the multichip package having the four-layer structure has been explained in this example, the memory chips may be laminated in four or more layers. Moreover, although the plurality of memory chips are laminated in this example, a plurality of LSI chips may be laminated, or both memory chips and LSI chips may be laminated.

(2) Second Embodiment

In the first embodiment, the memory chip on the upper layer side in the plurality of memory chips constituting the multichip package is translated and laminated in such a manner that the two sides of the upper surface of the memory chip on the lower layer side perpendicular to each other are exposed.

Additionally, arranging the power supply pads of the memory chip at the diagonal corners of the chip upper surface enables avoiding degradation in performance of the chip due to the internal wiring resistance.

However, when the plurality of memory chips are laminated to increase a capacity of the memory, a size of the package becomes large in a direction along which the memory chip is translated.

Thus, in the second embodiment, a structure of a multichip package that solves this problem will be explained. It is to be noted that the memory chips according to this embodiment have the same structure as the memory chips explained in the first embodiment, and the same effect as that described above can be obtained. Further, like reference numerals denote like members, thereby omitting a detailed explanation thereof.

Figure 5:
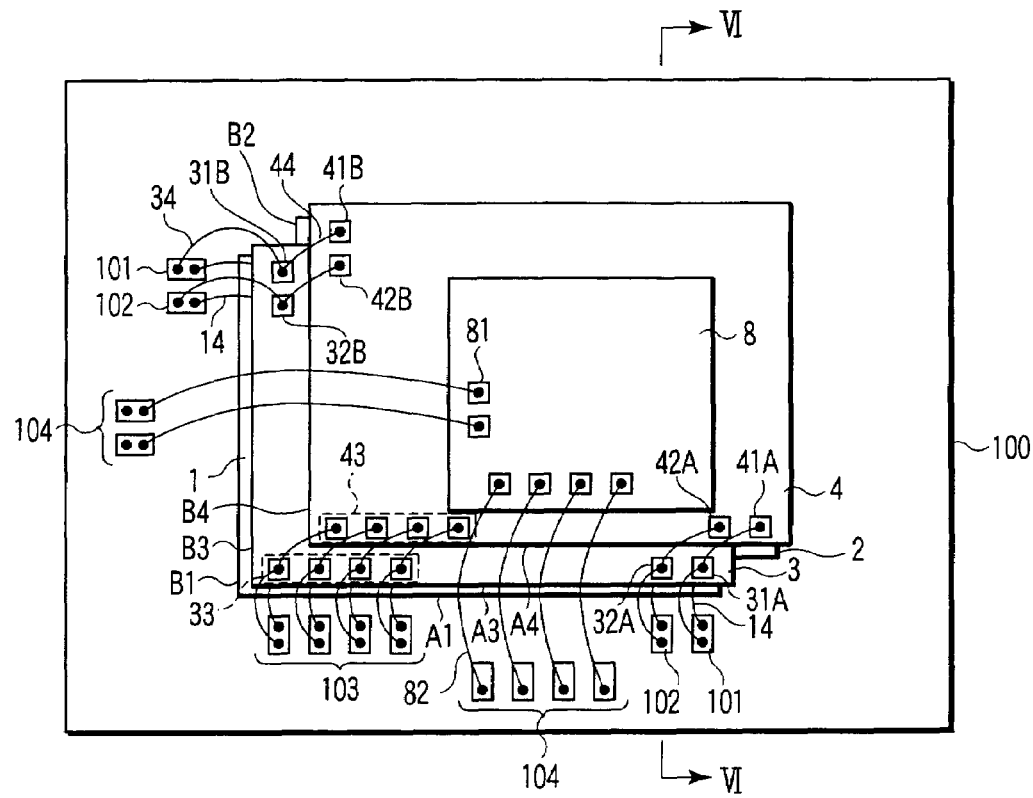
FIG. 5 is a plan view of a multichip package showing a configuration of a second embodiment.
Figure 6:
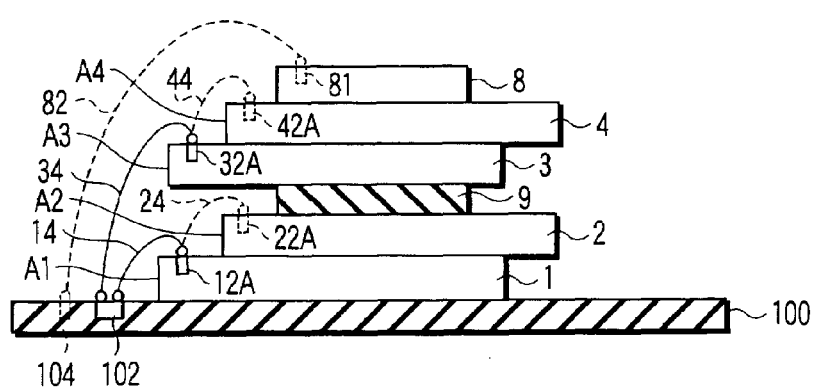
FIG. 6 is a cross-sectional view taken along a line VI-VI in FIG. 5.

As shown in FIGS. 5 and 6, a second memory chip 2 is laminated on a first memory chip 1 in such a manner that respective pads of the first memory chip 1 provided along a side A1 and a side B1 are exposed.

A spacer 9 formed of an insulator is provided on the second memory chip 2. A thickness of this spacer 9 is a thickness that enables assuring a space in a thickness direction for wire bonding of the second memory chip 2.

A third memory chip 3 is arranged on the second memory chip 2 through the spacer 9. This third memory chip 3 is translated with respect to the second memory chip 2 in a direction opposite to a translating direction of the second memory chip 2.

Furthermore, the third memory chip 3 is arranged at a position where it substantially overlaps the first memory chip 1. Specifically, the third memory chip 3 is arranged at a position where a first side A3 of the memory chip 3 substantially overlaps the first side A1 of the first memory chip 1 and a second side B3 of the memory chip 3 substantially overlaps the second side B1 of the first memory chip 1.

A fourth memory chip 4 is translated in such a manner that respective pads of the third memory chip 3 provided along the side A3 and the side B3 are exposed. Moreover, the fourth memory chip 4 is arranged at a position where it substantially overlaps the second memory chip 2.

That is, the memory chip (the fourth memory chip 4) in the uppermost layer is translated for the same distance as the second memory chip.

Additionally, wire bonding of the above-explained structure is carried out as follows.

The respective pads of the first memory chip 1 are connected with a package substrate 100 through wires 14. The respective pads of the second memory chip 2 are connected with the pads of the first memory chip through wires 24.

The respective pads of the third memory chip 3 are connected with the package substrate 100 through wires 34. The respective pads of the fourth memory chip 4 are connected with the respective pads of the third memory chip through wires 44.

That is, the second memory chip 2 is connected with the package substrate 100 through the first memory chip 1. Further, the fourth memory chip 4 is connected with the package substrate 100 via the third memory chip 3.

As explained above, in this embodiment, a size of the multichip package can be set within a size including the translated second memory chip 2.

Therefore, the multichip package according to this embodiment can be manufactured in a size including the translated second memory chip 2 even if the plurality of memory chips are laminated.

Accordingly, a reduction in performance of the multichip package can be avoided, and an increase in the package size of the multichip package can be suppressed. A storage capacity of the multichip package can be thereby increased.

It is to be noted that the multichip package in which the four memory chips are laminated has been explained in this embodiment. However, the present invention is not restricted thereto, and it is possible to adopt a structure where the three memory chips are laminated without laminating the fourth memory chip or a structure where a spacer is further provided on the fourth memory chip and another memory chip is further laminated thereon.

(3) Third Embodiment

In the structure of the multichip package according to the second embodiment, using the spacer suppresses a size of the multichip package in a plane direction from being increased in the translating direction of the memory chip when laminating the plurality of memory chips to increase a capacity.

However, adopting the spacer assures a space in a thickness direction required for wire bonding of the chip provided on the lower layer side of this spacer. Therefore, in the second embodiment, the thickness of this spacer increases the thickness of the multichip package.

A structure of a multichip package that solves this problem will now be explained hereinafter.

(a) Basic Structure

Figure 7:
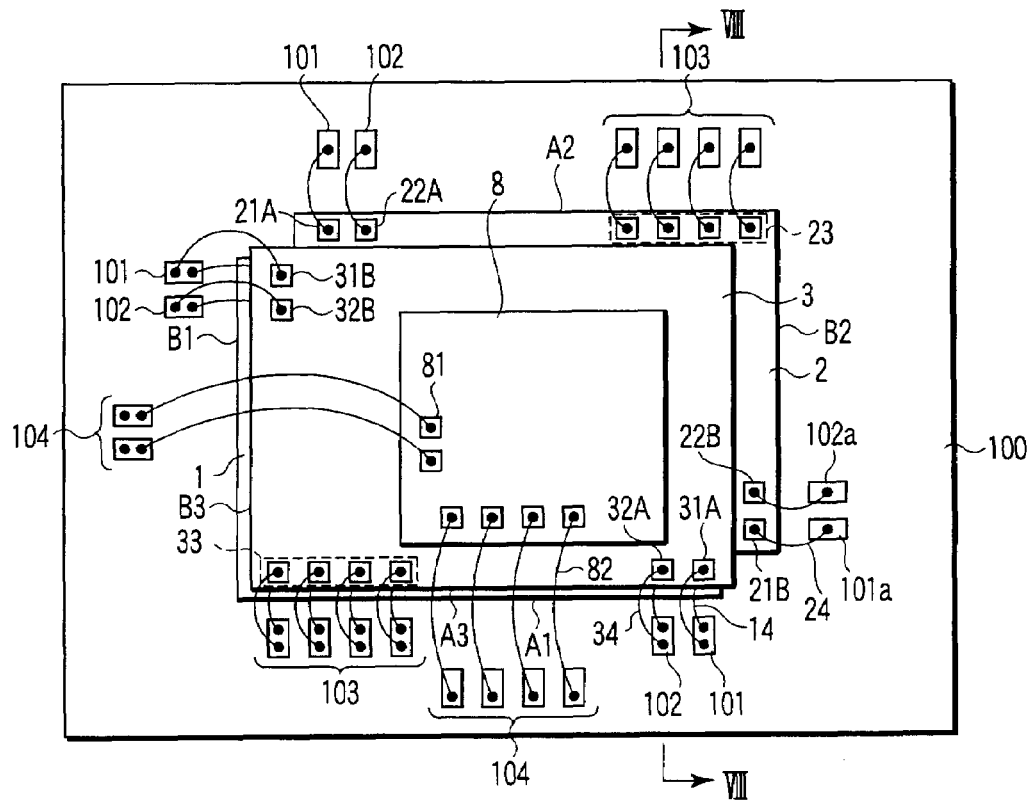
FIG. 7 is a plan view of a multichip package showing a basic configuration of a third embodiment.
Figure 8:
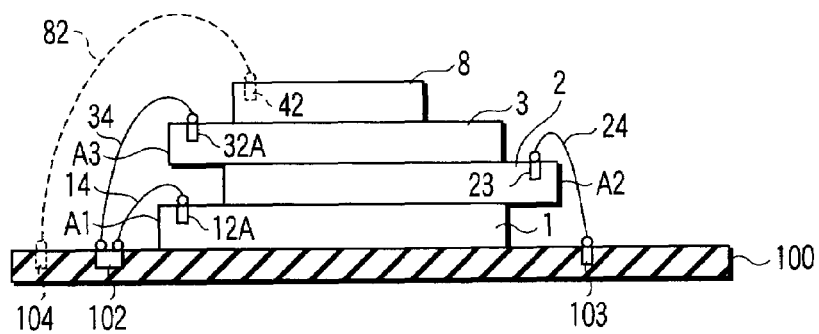
FIG. 8 is a cross-sectional view taken along a line VIII-VIII in FIG. 7.

FIGS. 7 and 8 are views showing a structure of a multichip package according to this embodiment. It is to be noted that memory chips according to this embodiment have the same structures as the memory chips according to the first embodiment, thereby obtaining the same effect. Furthermore, like reference numerals denote like members, thus omitting a detailed explanation thereof.

A plurality of memory chips 1, 2, and 3 and a controller chip 8 are laminated on a package substrate 100. That is, the second memory chip 2 is arranged between the first memory chip 1 and the third memory chip 3.

This second memory chip 2 is symmetrical in a lateral direction with respect to the first and third memory chips 1 and 3, translated on an upper surface of the first memory chip 1 in such a manner that two sides A1 and B1 on which pads of the first memory chip 1 are provided are exposed, and arranged on the memory chip 1.

The structure depicted in FIGS. 7 and 8 will now be explained in stages with reference to FIGS. 9 and 11. It is to be noted that wires will be omitted in the drawings.

Figure 9:
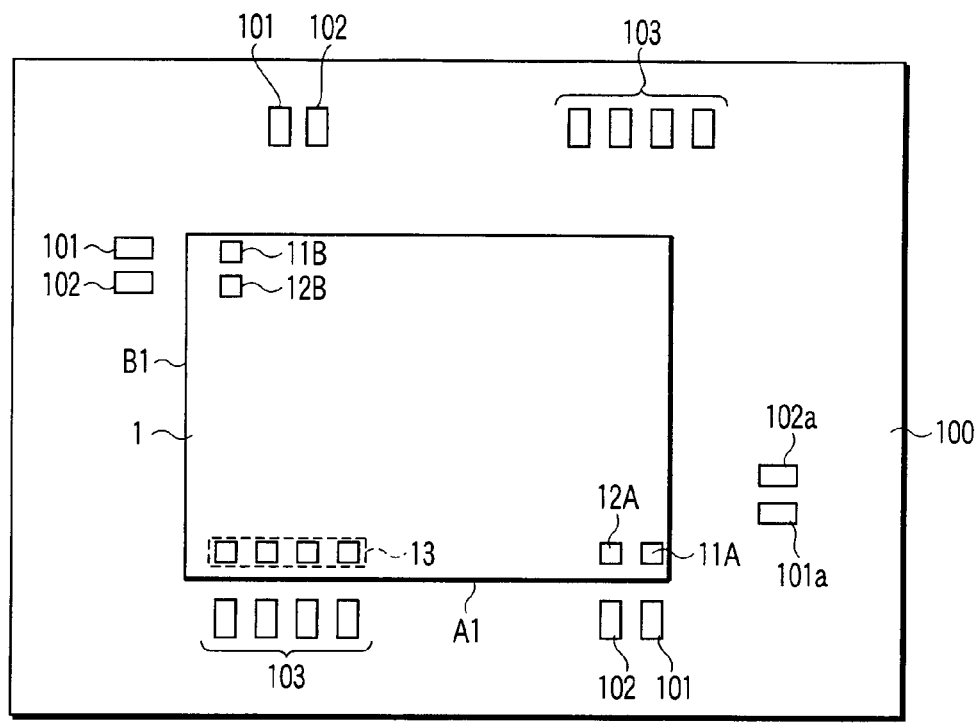
FIG. 9 is a plan view showing a configuration depicted in FIG. 7 in stages.

As shown in FIG. 9, the first memory chip 1 is provided on a package substrate 100.

Figure 10:
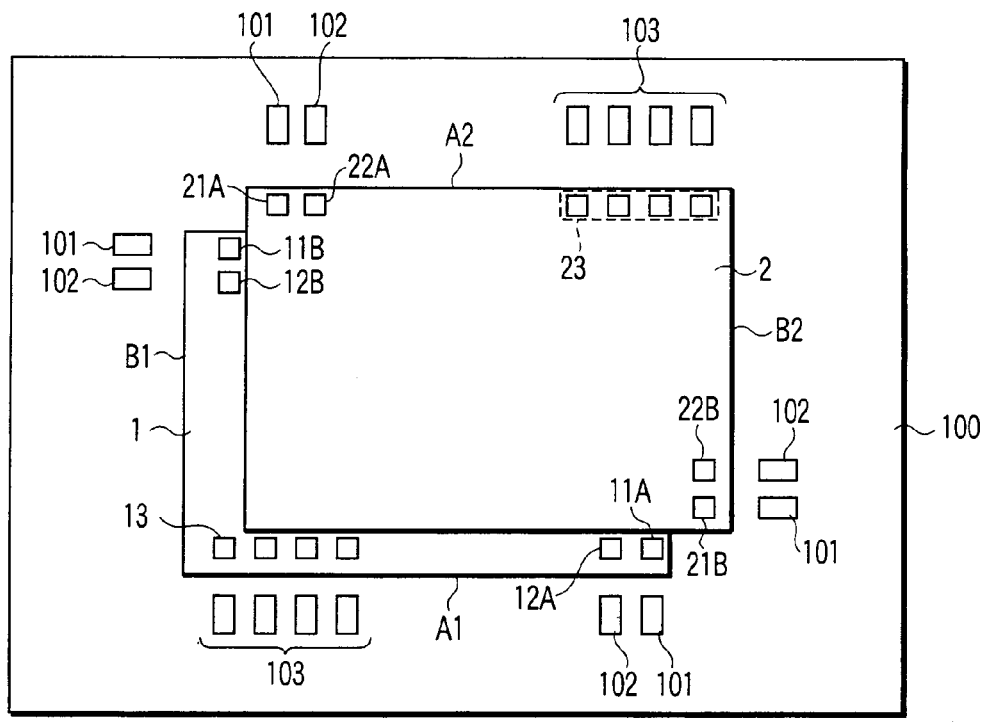
FIG. 10 is a plan view showing the configuration depicted in FIG. 7 in stages.

Further, as shown in FIG. 10, the second memory chip 2 is rotated 180° with respect to the first memory chip 1, and arranged to be flipped horizontally. Specifically, a first side A2 where pads of the second memory chip 2 are provided is placed to be opposed to a position of a first side A1 where pads of the first memory chip 1 are provided. Furthermore, a second side B2 where pads of the second memory chip 2 are provided is placed to be opposed to a position of a second side B1 where pads of the first memory chip 1 are provided.

Moreover, the second memory chip 2 is translated and arranged with respect to an upper surface of the first memory chip 1 in such a manner that the respective pads provided on upper surfaces of the first memory chip 1 along the two sides A1 and B2 perpendicular to each other are exposed.

As shown in FIG. 11, the third memory chip 3 is opposite to the second memory chip 2 in the lateral direction, and it is translated on an upper surface of the second memory chip 2 in a direction opposite to the translating direction of the second memory chip 2 and arranged on the second memory chip 2.

Additionally, the third memory chip 3 is arranged at a position where side A3 of the third memory chip 3 substantially overlaps side A1 of the first memory chip 1 and side B3 of the third memory chip 3 substantially overlaps side B1 of the first memory chip 1.

In case of the above-explained structure, substrate power supply pads 101, substrate ground pads 102, and memory pads 103 are provided on the package substrate 100 along first sides A1 and A3 and second sides B1 and B3 of memory chips 1 and 3 and first side A2 and second side B2 of memory chip 2. That is, these pads 101, 102, and 103 are arranged on the package substrate 100 to surround the peripheries of laminated memory chips 1, 2, and 3, and wire bonding between the pads of the respective memory chips is formed without becoming complicated.

Therefore, using the above-explained basic structure enables eliminating a need for arrangement of a spacer between the memory chips to be laminated and suppressing an increase in a size of the multichip package in a thickness direction.

(b) Example

An example of the above-explained structure will now be explained.

It is to be noted that like reference numerals denote like members, thereby omitting a detailed explanation thereof.

Figure 12:
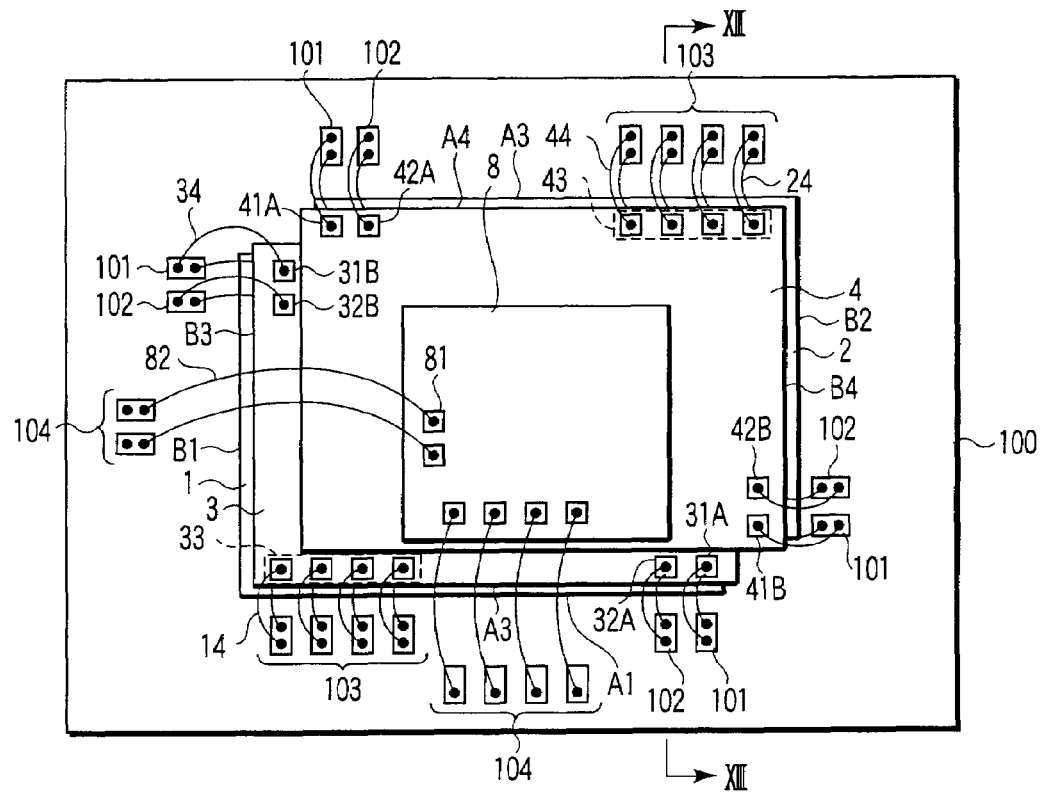
FIG. 12 is a plan view of a multichip package showing an example of the third embodiment.
Figure 13:
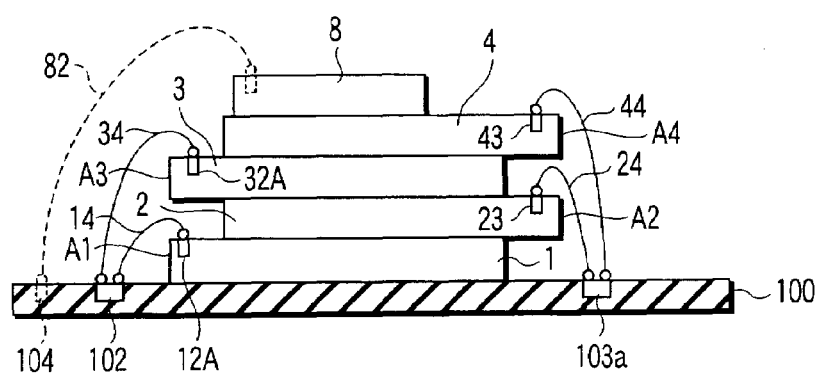
FIG. 13 is a cross-sectional view taken along a line XIII-XIII in FIG. 12.

As shown in FIGS. 12 and 13, besides the multichip package explained in the section of the basic structure, a fourth memory chip 4 is arranged on the third memory chip 3.

It is to be noted that each of the first to fourth memory chips 1, 2, 3 and 4 may be either a volatile semiconductor memory chip or a non-volatile semiconductor memory chip, or both the volatile memory chip and the non-volatile memory chip may be used.

The fourth memory chip 4 has the same configuration as the first to third memory chips 1, 2, and 3, and has pads arranged thereon.

Therefore, two pairs of power supply pads 41A and 41B are provided on an upper surface of the fourth memory chip 4 along side A4 and side B4, respectively.

Additionally, the two pairs of power supply pads 41A and 41B are arranged at diagonal corners of the upper surface of the memory chip 4. Further, a plurality of memory pads 43 are provided on the upper surface of the fourth memory chip 4 along first side A1 of the fourth memory chip 4.

The fourth memory chip 4 is opposite to the third memory chip 3 in a lateral direction, and it is translated in a direction opposite to the translating direction of the third memory chip 3 in such a manner that the respective pads provided along the two sides A3, B3 of the third memory chip 3 perpendicular to each other are exposed.

Furthermore, the fourth memory chip 4 is arranged at a position where side A4 of the fourth memory chip 4 substantially overlaps side A2 of the second memory chip 2 and side B4 of the fourth memory chip 4 substantially overlaps side B2 of the second memory chip 2.

As explained above, in the structure according to this example, the plurality of memory chips can be laminated, an increase in the multipackage size caused due to a spacer can be avoided, and a storage capacity can be increased.

Therefore, a reduction in performance of the multichip package can be avoided, and the package size of the multichip package can be suppressed from being increased. The storage capacity of the multichip package can be thereby increased.

It is to be noted that the multichip package having the four-layer structure has been explained in this example, but the memory chips may be laminated in four or more layers. Furthermore, although the plurality of memory chips are laminated in this example, a plurality of LSI chips may be laminated, or both memory chips and LSI memory chips may be laminated.

3. Others

The semiconductor device according to the examples of the present invention is applied to portable electronic devices, e.g., a mobile phone or a digital camera.

The examples of the present invention can avoid degradation of performance of the memory chips constituting the multichip package and suppress an increase in the size of the package.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a package substrate which has first and second pads to which a power supply voltage is applied on an upper surface thereof;
   a first memory chip which is arranged on the package substrate and which has a first power supply pad provided on a first side and a second power supply pad provided on a second side perpendicular to the first side, and which has a plurality of memory pads provided along the first side, the first and second power supply pads having the power supply voltage applied thereto; and
   a second memory chip which is translated in a direction along which the first and second power supply pads of the first memory chip are exposed, and arranged on the first memory chip, which has the same structure as the first memory chip, which has a first power supply pad provided on the first side and a second power supply pad provided on the second side perpendicular to the first side, and which has a plurality of memory pads provided along the first side, wherein the first and second power supply pads are provided at diagonal corners of the first and second memory chips, respectively,
   the first power supply pads of the first and second memory chips are electrically connected with the first pad of the package substrate,
   the second power supply pads of the first and second memory chips are electrically connected with the second pad of the package substrate, and
   the plurality of memory pads of the second memory chip are electrically connected with the plurality of memory pads of the first memory chip by bonding wires, respectively.

2. The semiconductor device according to claim 1, wherein the translating direction of the second memory chip is a diagonal direction along the upper surface of the first memory chip.

3. The semiconductor device according to claim 1, wherein each of the first and second memory chips further has first and second ground pads on the first and second sides at positions where they are adjacent to the first and second power supply pads.

4. The semiconductor device according to claim 1, further comprising a controller chip which is arranged on the second memory chip and which has a power supply pad, and which controls the first and second memory chips, wherein the power supply pad of the controller chip is electrically connected with the pads on the package substrate different from the pad on the package substrate connected the first and second power supply pads of the first memory chip.

5. The semiconductor device according to claim 1, further comprising a controller chip which is arranged on the second memory chip and which has a power supply pad, and which controls the first and second memory chips,
   wherein the power supply pad of the controller chip is electrically connected with the pads on the package substrate connected with the first and second power supply pads of the first memory chip.

6. A semiconductor device comprising:
   a package substrate which has first and second pads to which a power supply voltage is applied on an upper surface thereof;
   a first memory chip which is arranged on the package substrate and which has a first power supply pad provided on a first side and a second power supply pad provided on a second side perpendicular to the first side, the first and second power supply pads being provided as ones to which the power supply voltage is applied;
   a second memory chip which is translated in a direction along which the first and second power supply pads of the first memory chip are exposed, and arranged on the first memory chip, which has the same structure as the first memory chip, and which has a first power supply pad provided on the first side and a second power supply pad provided on the second side perpendicular to the first side; and
   a third memory chip which is translated in a direction opposite to the translating direction of the second memory chip, and arranged on the second memory chip through a spacer at a position where it overlaps the first memory chip, which has the same structure as the first memory chip, and which has a first power supply pad provided on the first side and a second power supply pad provided on the second side perpendicular to the first side,
   wherein the first and second power supply pads are provided at diagonal corners of the first to third memory chips, respectively,
   the first power supply pads of the first to third memory chips are electrically connected with the first pad of the package substrate,
   the second power supply pads of the first to third memory chips are electrically connected with the second pad of the package substrate.

7. The semiconductor device according to claim 6, wherein the translating direction of the second memory chip is a diagonal direction along the upper surface of the first memory chip.

8. The semiconductor device according to claim 6, wherein each of the first to third memory chips further has first and second ground pads on the first and second sides at positions where they are adjacent to the first and second power supply pads.

9. The semiconductor device according to claim 6, wherein each of the first to third memory chips has a plurality of memory pads provided along the first side, and the plurality of memory pads of the second memory chip are electrically connected with the plurality of memory pads of the first memory chip through bonding wires, respectively.

10. The semiconductor device according to claim 6, further comprising a controller chip which is arranged on the second memory chip and which has a power supply pad, and which controls the first and second memory chips, wherein the power supply pad of the controller chip is electrically connected with the pads on the package substrate different from the pad on the package substrate connected the first and second power supply pads of the first memory chip.

11. The semiconductor device according to claim 6, further comprising a controller chip which is arranged on the second memory chip and which has a power supply pad, and which controls the first and second memory chips,
wherein the power supply pad of the controller chip is electrically connected with the pads on the package substrate connected with the first and second power supply pads of the first memory chip.

12. A semiconductor device comprising:
a package substrate which has a first pad provided on a first edge, which has a second pad provided on a second edge perpendicular to the first edge, which has a third pad provided on a third edge facing the first edge and contacting the second edge, and which has a fourth pad provided on a fourth edge facing the second edge and contacting the first and third edge, the first to fourth pads being provided as ones to which a power supply voltage is applied;
a first memory chip which is arranged on the package substrate and which has a first power supply pad provided on a first side and a second power supply pad provided on a second side perpendicular to the first side, the first and second power supply pads being provided as ones to which the power supply voltage is applied;
a second memory chip which is opposite to the first memory chip in a lateral direction, translated in a direction along which the first and second power supply pads of the first memory chip are exposed, and arranged on the first memory chip, which has the same structure as the first memory chip, and which has a first power supply pad provided on a first side and a second power supply pad provided on a second side perpendicular to the first side; and a third memory chip which is translated in a direction opposite to the translating direction of the second memory chip and arranged on the second memory chip, which has the same structure as the first memory chip, and which has a first power supply pad provided on a first side and a second power supply pad provided on a second side perpendicular to the first side,
wherein the first and second power supply pads are provided at diagonal corners of the first to third memory chips, respectively,
the first power supply pads of the first and third memory chips are electrically connected with the first pad,
the second power supply pads of the first and third memory chips are electrically connected with the second pad,
the first power supply pad of the second memory chip is electrically connected with the third pad,
the second power supply pad of the second memory chip is electrically connected with the fourth pad.

13. The semiconductor device according to claim 12, wherein the translating direction of the second memory chip is a diagonal direction along the upper surface of the first memory chip.

14. The semiconductor device according to claim 12, wherein each of the first to third memory chips further has first and second ground pads on the first and second sides at positions where they are adjacent to the first and second power supply pads.

15. The semiconductor device according to claim 12, wherein each of the first to third memory chips further has a plurality of memory pads provided along the first side.

16. The semiconductor device according to claim 15, wherein the package substrate has a plurality of pads connected with the plurality of memory pads of the first to third memory chips, and the plurality of pads are arranged on the package substrate to surround peripheries of the laminated first to third memory chips.

* * * * *